(12) United States Patent
Elsayed

(10) Patent No.: US 10,497,455 B2
(45) Date of Patent: Dec. 3, 2019

(54) APPARATUS FOR SAMPLING ELECTRICAL SIGNALS WITH REDUCED LEAKAGE CURRENT AND ASSOCIATED METHODS

(71) Applicant: Silicon Laboratories Inc., Austin, TX (US)

(72) Inventor: Mohamed M. Elsayed, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/676,743

(22) Filed: Aug. 14, 2017

(65) Prior Publication Data

US 2019/0051368 A1     Feb. 14, 2019

(51) Int. Cl.
| | | |
|---|---|---|
| *G11C 27/02* | (2006.01) | |
| *H03K 5/00* | (2006.01) | |
| *H03K 17/16* | (2006.01) | |

(52) U.S. Cl.
CPC ......... *G11C 27/024* (2013.01); *H03K 17/161* (2013.01)

(58) Field of Classification Search
CPC combination set(s) only.
See application file for complete search history.

(56) References Cited

U.S. PATENT DOCUMENTS

| | | | |
|---|---|---|---|
| 5,422,583 A | 6/1995 | Blake | |
| 5,945,872 A | 8/1999 | Robertson | |
| 6,265,911 B1 * | 7/2001 | Nairn | G11C 27/024 327/91 |
| 6,329,848 B1 * | 12/2001 | Maes | G11C 27/024 327/91 |
| 6,504,406 B1 | 1/2003 | Kakitani | |
| 6,577,168 B1 | 6/2003 | Kakitani | |
| 7,298,010 B1 | 11/2007 | Ma | |
| 7,385,427 B2 * | 6/2008 | Lim | G11C 27/02 327/92 |
| 7,532,042 B2 | 5/2009 | Lee | |
| 7,636,075 B2 | 12/2009 | Shin | |
| 7,812,646 B2 | 10/2010 | Augustyniak | |
| 8,115,518 B1 | 2/2012 | Ali | |
| 8,415,985 B2 * | 4/2013 | Cheeranthodi | G11C 27/026 327/94 |
| 8,723,556 B2 * | 5/2014 | Thomas | G11C 27/02 327/94 |
| 8,766,670 B2 | 7/2014 | Chen | |
| 2002/0167343 A1 | 11/2002 | Erhart et al. | |
| 2016/0104543 A1 | 4/2016 | Powell | |

OTHER PUBLICATIONS

U.S. Appl. No. 15/676,731, Elsayed, filed Aug. 2017.
U.S. Appl. No. 15/676,757, Elsayed, filed Aug. 2017.

(Continued)

*Primary Examiner* — An T Luu
(74) *Attorney, Agent, or Firm* — Law Offices of Maximilian R. Peterson

(57) ABSTRACT

An apparatus includes a sample-and-hold (S/H) circuit. The S/H circuit includes a first switch coupled to receive an input signal. The first switch is further coupled to a first capacitor. The S/H circuit further includes a buffer coupled to the first switch. In addition, the S/H circuit includes a voltage source coupled to an input of the buffer to apply an offset voltage to the input of the buffer.

20 Claims, 11 Drawing Sheets

(56) References Cited

OTHER PUBLICATIONS

Analog Devices, "Sample-and-Hold Amplifiers, Introduction and Historical Perspective," 2009, 21 pgs.
Kim et al., "Sample & Hold Circuits," 2011, 22 pgs.
Balaz, "Versatile Sample & Hold Circuit for Industrial and T&M Applications," 2013, 24 pgs.
Intersil Application Note AN517.0, "Applications of Monolithic Sample-and-Hold Amplifiers," 2005, 5 pgs.
Office communication in U.S. Appl. No. 15/676,731, dated May 15, 2018.
Office communication in U.S. Appl. No. 15/676,731, dated Oct. 3, 2018.
Office communication in U.S. Appl. No. 15/676,731, dated Dec. 14, 2018.
Office communication in U.S. Appl. No. 15/676,757, dated Jul. 23, 2018.
Office communication in U.S. Appl. No. 15/676,757, dated Oct. 29, 2018.
Office communication in U.S. Appl. No. 15/676,731, dated Apr. 16, 2019.
Office communication in U.S. Appl. No. 15/676,757, dated Apr. 29, 2019.

* cited by examiner

APPARATUS FOR SAMPLING ELECTRICAL SIGNALS WITH REDUCED LEAKAGE CURRENT AND ASSOCIATED METHODS

CROSS-REFERENCE TO RELATED APPLICATIONS

This application is related to, and incorporates by reference in their entireties for all purposes, the following concurrently filed applications: (a) U.S. patent application Ser. No. 15/676,731, titled "Apparatus for Sampling Electrical Signals with Improved Hold Time and Associated Methods,"; and (b) U.S. patent application Ser. No. 15/676,757, titled "Reduced-Leakage Apparatus for Sampling Electrical Signals and Associated Methods,".

TECHNICAL FIELD

The disclosure relates generally to signal sampling circuitry and, more particularly, to apparatus for sample-and-hold (S/H) circuitry, and associated methods.

BACKGROUND

Modern ICs have helped to integrate electronic circuitry to decrease size and cost. As a consequence, modern ICs can form complex circuitry and systems. For example, virtually all of the functionality of a system may be realized using one or a handful of ICs. Such circuitry and systems may receive and operate on both analog and digital signals, and may provide analog and digital signals.

In some situations, a circuit may use the value of an analog signal. Sometimes a S/H circuit is used to sample the level of the analog signal. The S/H circuit holds the sampled value until it is used by the circuit.

The description in this section and any corresponding figure(s) are included as background information materials. The materials in this section should not be considered as an admission that such materials constitute prior art to the present patent application.

SUMMARY

A variety of apparatus and associated methods are contemplated according to exemplary embodiments. According to one exemplary embodiment, an apparatus includes a S/H circuit. The S/H circuit includes a first switch coupled to receive an input signal. The first switch is further coupled to a first capacitor. The S/H circuit further includes a buffer coupled to the first switch. In addition, the S/H circuit includes a voltage source coupled to an input of the buffer to apply an offset voltage to the input of the buffer.

According to another exemplary embodiment, an apparatus includes a S/H circuit. The S/H circuit includes a transistor to provide an input signal that is to be sampled to a first capacitor. The S/H circuit further includes a duty-cycled buffer to selectively buffer a voltage across the first capacitor and to provide a buffered voltage to a node coupled to a bulk of the transistor in order to reduce a power consumption of the S/H circuit.

According to another exemplary embodiment, a method of using a S/H circuit, having a sample mode and a hold mode, includes providing, by using a first switch, an input signal to be sampled to a first capacitor. The method further includes buffering, by using a buffer, a voltage across the first capacitor to provide a buffered voltage. The method further includes providing an offset voltage, by using a voltage source coupled to an input of the buffer, to the input of the buffer.

BRIEF DESCRIPTION OF THE DRAWINGS

The appended drawings illustrate only exemplary embodiments and therefore should not be considered as limiting the scope of the application or the claims. Persons of ordinary skill in the art will appreciate that the disclosed concepts lend themselves to other equally effective embodiments. In the drawings, the same numeral designators used in more than one drawing denote the same, similar, or equivalent functionality, components, or blocks.

DETAILED DESCRIPTION

The disclosed concepts relate generally to S/H circuits. More specifically, the disclosed concepts provide apparatus and methods for S/H circuits with improved performance.

Figure 1:
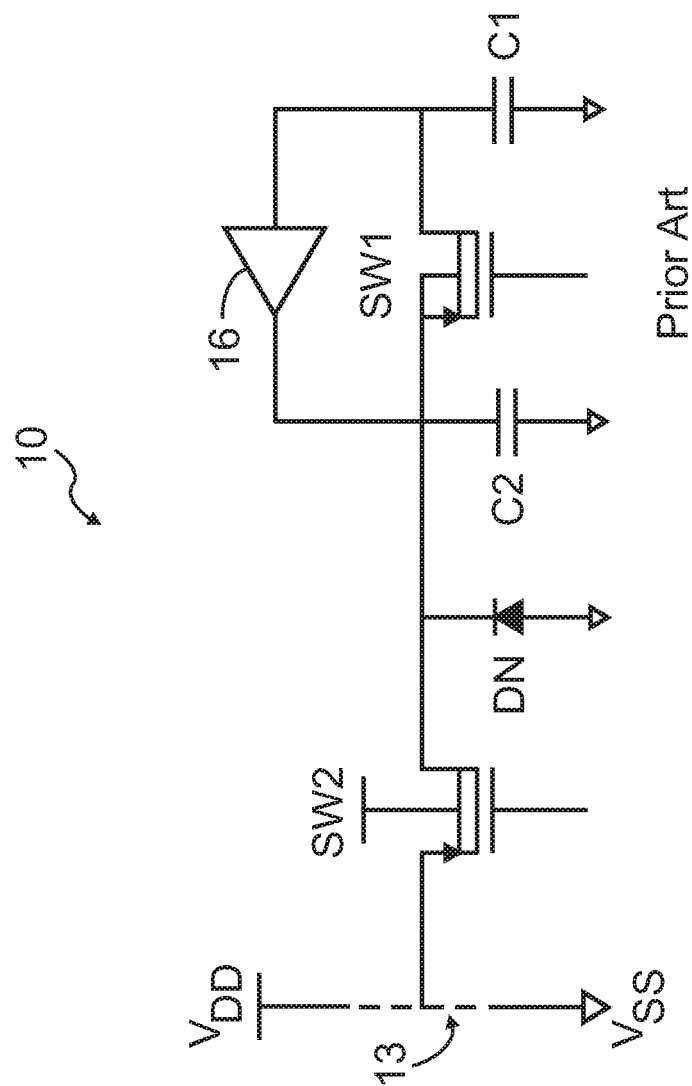
FIG. 1 shows a conventional S/H circuit that uses a buffer.

FIG. 1 shows a conventional S/H circuit 10. S/H circuit 10 includes input circuit 13. Input circuit 13 may include one or more switches, current source, and the like, in order to sample the input voltage (not shown), as persons of ordinary skill in the art understand. By virtue of the operation of input circuit 13, the source of transistor SW2 may be coupled to the supply voltage ($V_{DD}$), the input voltage (to be sampled), or the ground voltage ($V_{SS}$), as persons of ordinary skill in the art understand.

As shown, S/H circuit 10 uses output capacitor, C1, and a sampling switch, SW1. In order to reduce the leakage current through SW1, another capacitor, C2, and another switch, SW2, are employed such that the voltage across SW1 is zero. As a consequence, the current though SW1 is zero or nearly zero, and the output node (the top plate of capacitor C1), will leak relatively small current, which allows the circuit to hold the sampled voltage.

The hold time of the output voltage of S/H circuit 10 is limited by the hold time of the intermediate capacitor, C2. The intermediate capacitor is subject to various types of leakage currents, which result in the decay of the output voltage and, thus, limit the hold time of the circuit. A buffer 16 is added to reduce the leakage current of S/H circuit 10.

The addition of buffer 16 seeks to make the voltage across the sampling switch SW1 zero so that the output voltage can be held indefinitely. Circuit mismatches in buffer 16 introduce an offset voltage that appears across switch SW1. The offset voltage is not deterministic, and the leakage current is different for positive and negative offset voltages, which means that both positive and negative offset voltages are often considered in the deign process.

One aspect of the disclosure relates to intentionally adding an offset voltage to the input of a buffer in a S/H circuit in order to reduce the leakage current. In exemplary embodiments, the intentional offset voltage is added by using a buffer with an intentionally mismatched input stage or circuit.

Figure 2:
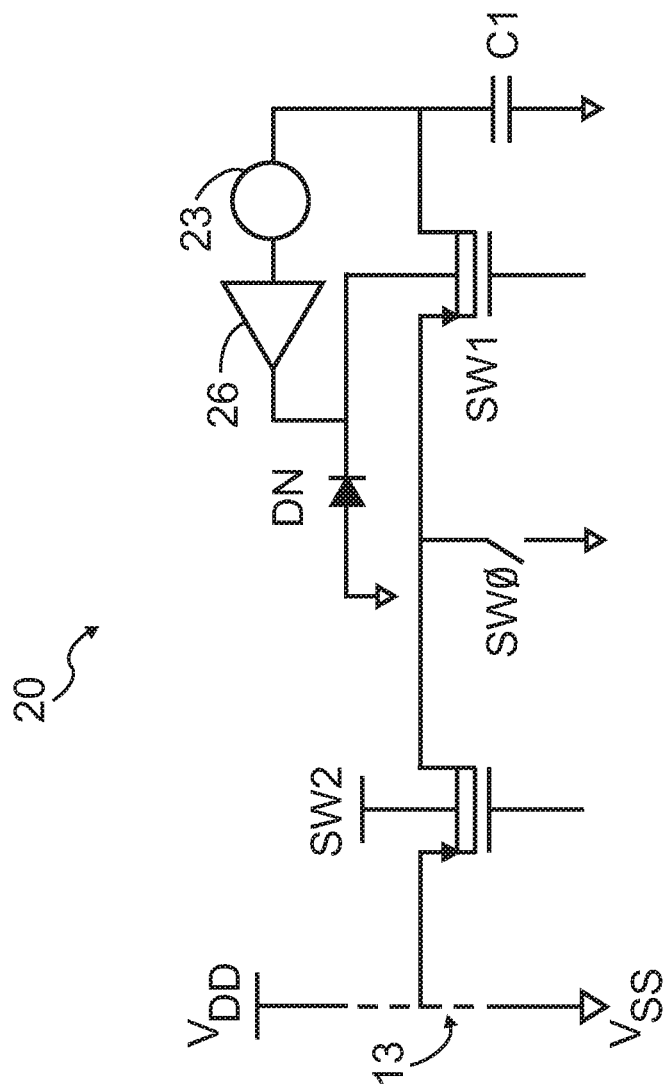
FIG. 2 shows a circuit arrangement for a S/H circuit according to an exemplary embodiment.

FIG. 2 shows a circuit arrangement for a S/H circuit 20 according to an exemplary embodiment. In the embodiment shown, a buffer 26 is used that has an intentionally introduced offset voltage, denoted by voltage source 23 coupled to the input of buffer 26. Buffer 26 may be considered a skewed buffer in that it has an intentionally added input offset voltage.

In exemplary embodiments, buffer 26 has a skewed (unbalanced) input stage that introduces an intentional positive input offset voltage. In exemplary embodiments, the skew is designed such that the mismatches during the fabrication process do not make the total or overall input offset voltage of buffer 26 negative. This technique results in the bulk-drain junction of transistor SW1 to be reverse biased under various (or all) operating conditions.

The intentionally added input offset voltage may be introduced in a variety of ways. Some examples are described below.

In some embodiments, voltage source 23 may not be physically present as a separate element or voltage source in the circuit but, instead buffer 26 may be designed with an intentional mismatch in its circuitry. As a result of the mismatch, an equivalent input offset voltage will be present at the input of buffer 26, which is represented in S/H circuit 20 as voltage source 23.

In other embodiments, however, a buffer 26 may be used that has no intentionally added input offset voltage (for instance, the input circuitry is matched (or nearly matched, as would be the case in a practical implementation)). In such a situation, a voltage source 23 may be used to intentionally introduce an offset voltage at the input of buffer 26.

S/H circuit 20 also has a switch SW0 coupled to the output of buffer 26 and to circuit ground. Switch SW0 is therefore coupled to a node that is coupled to switch SW1 and to switch SW2.

Referring again to FIG. 2, switch SW2, implemented using a metal oxide semiconductor field effect transistor (MOSFET) in the embodiment shown, is coupled to input circuit 13. Specifically, the source of SW2 is coupled to input circuit 13, while the bulk and gate of SW2 are coupled to the supply voltage.

The drain of SW2 is coupled to switch SW0 and to switch SW1. In the embodiment shown, switch SW1 is implemented as a MOSFET, whose source is coupled to switch SW0 and to the drain of switch SW2.

During the sample mode of operation, i.e., when S/H circuit 20 samples the input voltage, switch SW0 is open. Thus, switch SW0 has no effect on the operation of the rest of S/H circuit 20 (or has relatively small or negligible effect, because of mechanisms such as leakage currents through or from switch SW0 in a practical implementation).

Conversely, during the hold mode of operation, i.e., when S/H circuit 20 holds the sampled voltage and provides it as the output voltage across capacitor C1, switch SW0 is closed. Note that closing switch SW0 pulls the drain of transistor SW2 and the source of transistor SW1 down to the ground voltage. In other embodiments, instead of switch SW0, another mechanism may be used to pull down the node between switches SW1 and SW2, such as a resistor.

In some embodiments, switch SW0 is controlled via a controller (not shown). By applying a control signal, the controller may cause switch SW0 to be opened or closed, depending on whether S/H circuit 20 is sampling or holding.

In various embodiments, the controller may be implemented in a variety of ways, as persons of ordinary skill in the art will understand. Without limitation, examples include finite state machines, general logic controllers or circuits, and the like, as desired, and as persons of ordinary skill in the art will understand.

In some embodiments, the controller may be a host. The host may take a variety of forms and include a variety of circuitry, as persons of ordinary skill in the art will understand. Without limitation, the host may be a processor, MCU, and the like, as persons of ordinary skill in the art will understand.

The host may communicate with or interface with switch SW0. By applying a control signal, the host may cause switch SW0 to be opened or closed, depending on whether S/H circuit 20 is sampling or holding.

In some embodiments, a control signal may be applied directly to switch SW0, without using a controller or host. In this situation, the user of S/H circuit 20 or a circuit under the control of the user or other source, may apply a control signal to cause switch SW0 to open or close, as described above.

Switch SW0, and generally other switches in S/H circuit 20, may be implemented in a variety of ways, as persons of ordinary skill in the art will understand. Without limitation, the switches may be implemented using MOSFETs, as desired. In the example shown in FIG. 2, switches SW1 and SW2 are realized using p-channel MOSFETs.

Diode DN is a parasitic diode, present when S/H circuit is implemented in an IC. More specifically, diode DN represents the junction between the n-well that includes switch SW1 and the p-type substrate when S/H circuit 20 is realized as part of an IC, such as a complementary metal oxide semiconductor (CMOS) IC.

Figure 4:
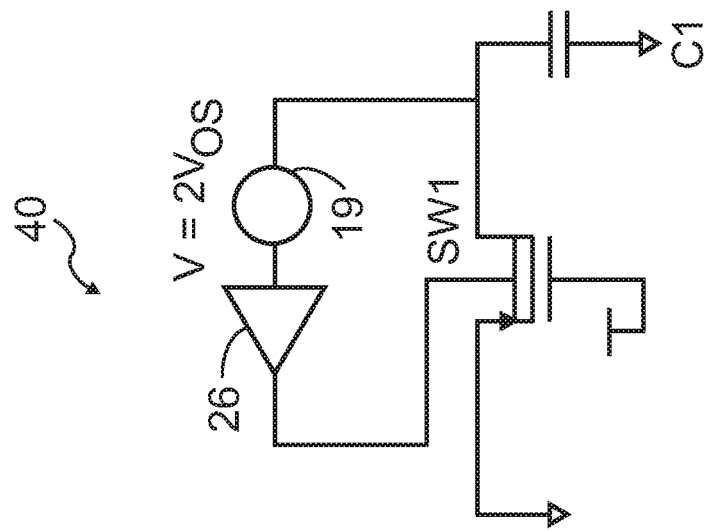
FIG. 4 shows a circuit arrangement for testing the performance of S/H circuit of FIG. 2.
Figure 3:
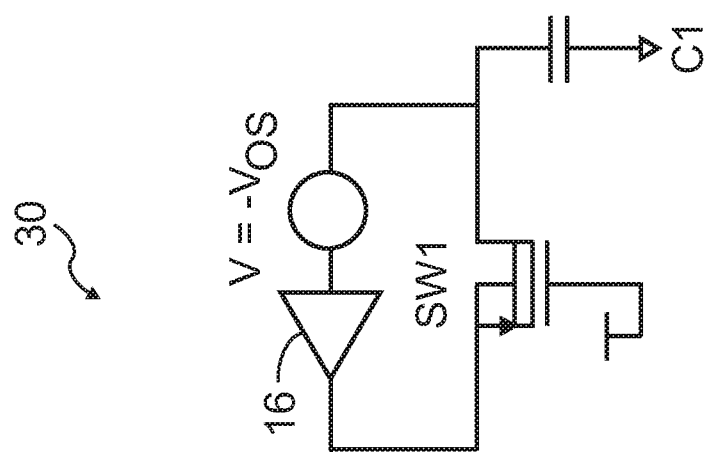
FIG. 3 shows a circuit arrangement for testing the performance of S/H circuit of FIG. 1.

FIGS. 3 and 4 show circuit arrangements for testing the relative performances of S/H circuit 10 (see FIG. 1) and S/H circuit 20 (see FIG. 2). More specifically, FIG. 3 shows circuit arrangements 30 for testing S/H circuit 10 of FIG. 1. A voltage source V is used to represent the inherent or internal input offset voltage of buffer 16. For S/H circuit 10, the offset voltage is negative, and is represented by voltage source V, having a voltage of $-V_{os}$.

Conversely, FIG. 4 shows a circuit arrangement 40 for testing S/H circuit 20 of FIG. 2. In circuit arrangement 40, a voltage source 19 having a voltage of $V=2 \cdot V_{os}$ is used. Voltage source 19 represents the intentionally added input offset voltage for buffer 26. The offset voltage is typically a random offset voltage of buffer 16, which may be zero, negative, or positive, and depends on various factors, such as the semiconductor fabrication process and characteristics of the devices used to implement buffer 26. For example, in some fabrication processes, the offset voltage may vary within the range of −5 mV to +5 mV. The offset voltage is typically not constant across ICs, and varies from chip to chip or IC to IC.

S/H circuit 20 in FIG. 2 adds a constant, non-random offset voltage that is equal to the maximum expected absolute value of the negative offset voltage of buffer 16. For example, suppose the maximum expected negative offset voltage of buffer 16 is −5 mV. A voltage of abs(−5 mV)), or 5 mV, is used for voltage source 23, where "abs" denotes the absolute-value function. The maximum expected negative offset voltage depends, as noted, on factors such as the semiconductor fabrication process and characteristics of the devices used to implement buffer 26, and may be obtained via simulation and/or test/characterization of the buffer after fabrication. The 5 mV value of voltage source 23, added to the internal offset voltage of buffer 16 (which ranges from −5 mV to +5 mV in this example, results in an overall offset voltage in the range of 0 to 10 mV. Thus, by intentionally adding a voltage provided by voltage source 23, the random offset voltage is converted to a known, positive offset voltage. In some embodiments, half or roughly half the total offset voltage 2·Vos is added intentionally in the design of buffer 26, and the other half (or roughly half) is used to account for process mismatches in the real circuit (circuitry used, for example, in an IC, to implement buffer 26).

Figure 5:
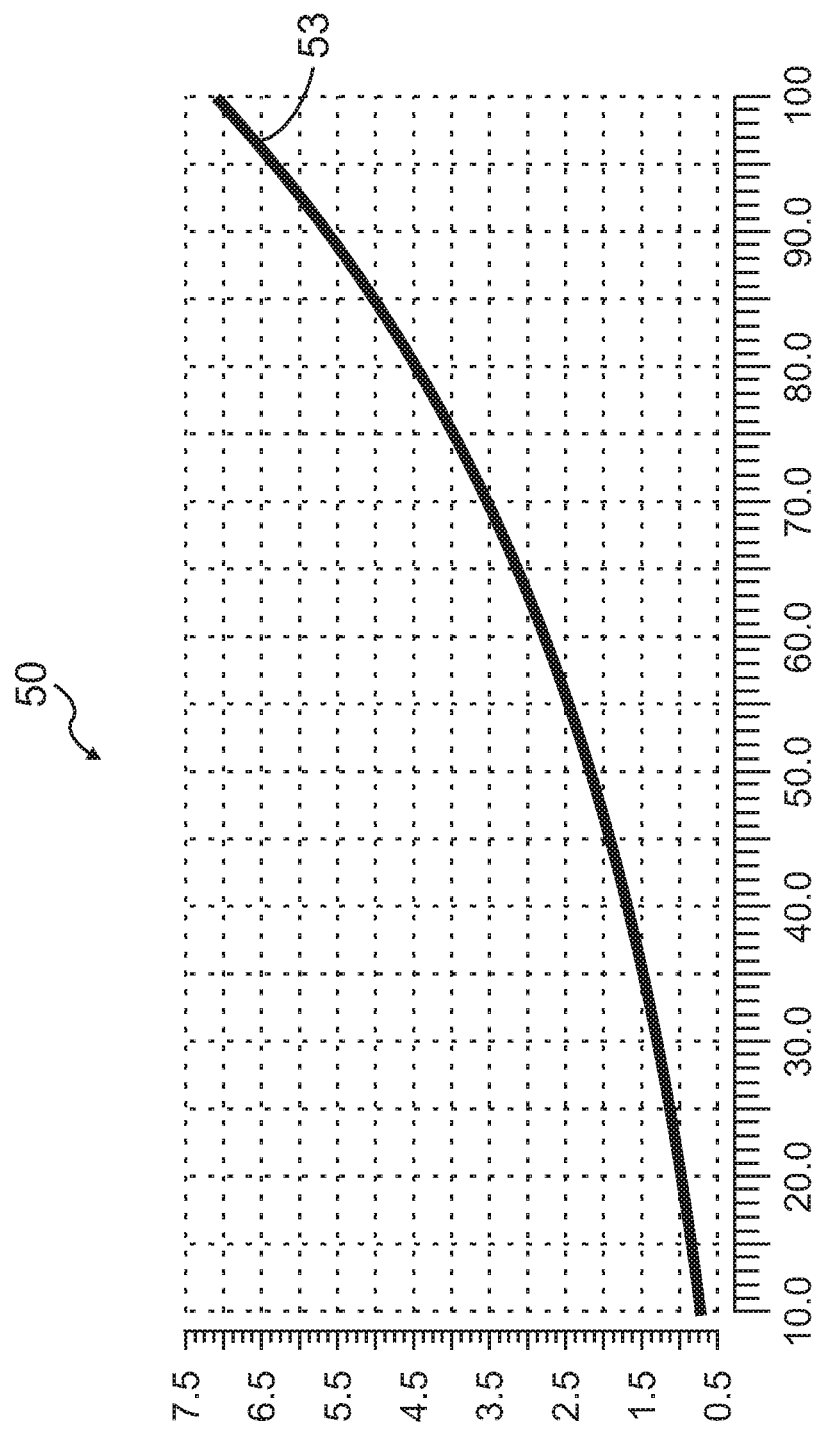
FIG. 5 shows a plot to illustrate performance of a S/H circuit according to an exemplary embodiment.

FIG. 5 shows a plot 50 to illustrate performance of a S/H circuit according to an exemplary embodiment. More specifically, plot 50 shows the ratio of the hold time of S/H circuit 20 (see FIG. 2) to the hold time of S/H circuit 10 (see FIG. 1) as a function of the input offset voltage ($V_{os}$). As plot 50 illustrates, for input offset voltages of around 20 mV, S/H circuit 20 provides longer hold times than S/H circuit 10.

The improved hold time allows less frequent sampling of the input voltage (not shown). Thus, a host or controller that interfaces with S/H circuit 20 may use fewer clock cycles to sample the output voltage of S/H circuit 20, i.e., the voltage across capacitor C1, because the interval between reading the output voltage may be increased.

The improved hold time allows reduction of the power consumption of the circuit that includes S/H circuit 20 during a low-power (or sleep or hibernate or shutdown or power-down) mode of operation. More specifically, because S/H circuit 20 can maintain or hold the output voltage for a longer period, the circuit, or parts of the circuit, that includes S/H circuit 20 may be placed in a low-power mode for a longer period of time.

Figure 6:
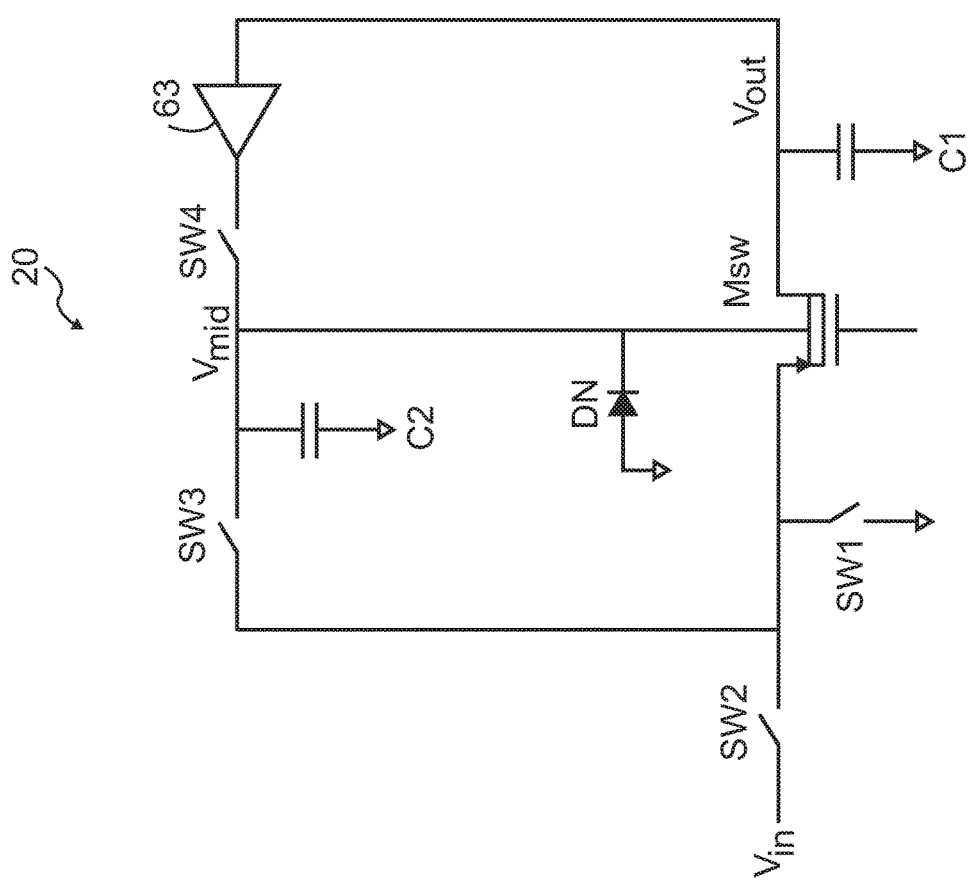
FIG. 6 shows a circuit arrangement for a S/H circuit according to an exemplary embodiment.

One aspect of the disclosure relates to S/H circuits that use duty-cycled buffers. FIG. 6 shows a circuit arrangement for a S/H circuit 20 according to an exemplary embodiment that uses this technique.

S/H circuit 20 uses switches SW1-SW4, plus switch Msw (a MOSFET in the embodiment shown). In addition, S/H circuit 20 includes capacitors C1 and C2, and duty-cycled buffer 63. The input voltage, i.e., the voltage to be sampled, is provided to a common node of switches SW1 and SW2 via switch SW2. Switch SW3 couples the common node of switches SW1 and SW2 to capacitor C2. The voltage across capacitor C2 is labeled "Vmid."

Switch SW4 couples the output of duty-cycled buffer 63 to capacitor C2 (voltage Vmid)). The input of duty-cycled buffer 63 is coupled to capacitor C1, and is therefore driven by output voltage Vout of S/H circuit 20.

The source of transistor Msw is coupled to switches SW1, SW2, and SW3. The bulk of transistor Msw is coupled to diode DN and to capacitor C2 (voltage Vmid). The drain of transistor Msw is coupled to capacitor C1 (voltage Vout).

As noted, S/H circuit 20 in FIG. 6 uses a duty-cycled buffer 63. More specifically, referring to FIGS. 1-2, buffer 16 and buffer 26 in those S/H circuits are continuously on, and therefore conducts some current (say, several nanoamperes or tens of nanoamperes in some embodiments) and consumes a certain amount of power continuously. In contrast, S/H circuit 20 in FIG. 6 uses a duty-cycled buffer 63, rather than a buffer that is continuously on.

In other words, at least some of the circuitry in duty-cycled buffer 63 is not on continuously, and instead operates in a duty-cycled manner. Thus, at least some of the circuitry in duty-cycled buffer 63 is on during some time periods and is off during other time periods. In effect, duty-cycled buffer 63 selectively buffers (when duty-cycled buffer 63 is on or enabled) the output voltage (the voltage across capacitor C1) and provides the buffered output voltage to the node coupled to the bulk of transistor Msw (the node with the voltage Vmid).

The output of duty-cycled buffer 63 is sampled and held. Whenever the voltage across capacitor C2, i.e., voltage $V_{mid}$, drops because of current leakages in S/H circuit 20, the duty-cycled buffer 63 is enabled to refresh it.

Instead of two modes of operation, i.e., sample and hold, as does S/H circuit 20 in FIG. 2, S/H circuit 20 in FIG. 6 has three modes or phases of operation: sample, hold, and refresh. The operating modes of S/H circuit 20 are described below in detail.

Figure 7:
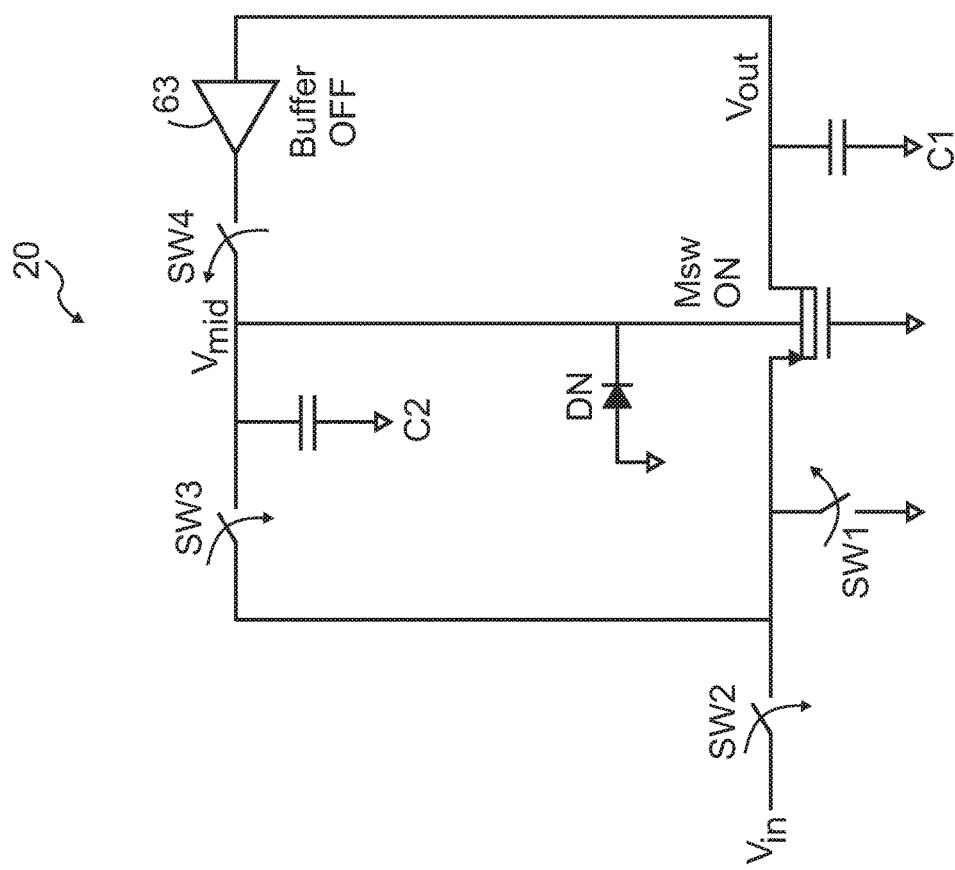
FIG. 7-9 show various modes of operation of a S/H circuit according to an exemplary embodiment.

FIG. 7 shows the sampling mode. During the sampling mode, switches SW1 and SW4 are off. Transistor Msw and switch SW2 are on. As a result, capacitor C1 is charged from input voltage Vin. In addition, switch SW3 is also on. As a consequence, capacitor C2 is also charged from input voltage Vin. As switch SW4 is off, i.e., the output of duty-cycled buffer 63 is isolated from capacitor C2 (with voltage Vmid), at least some (or perhaps all) of the circuitry in duty-cycled buffer 63 is turned off (or powered down or unpowered or disabled) to reduce power consumption.

Figure 8:
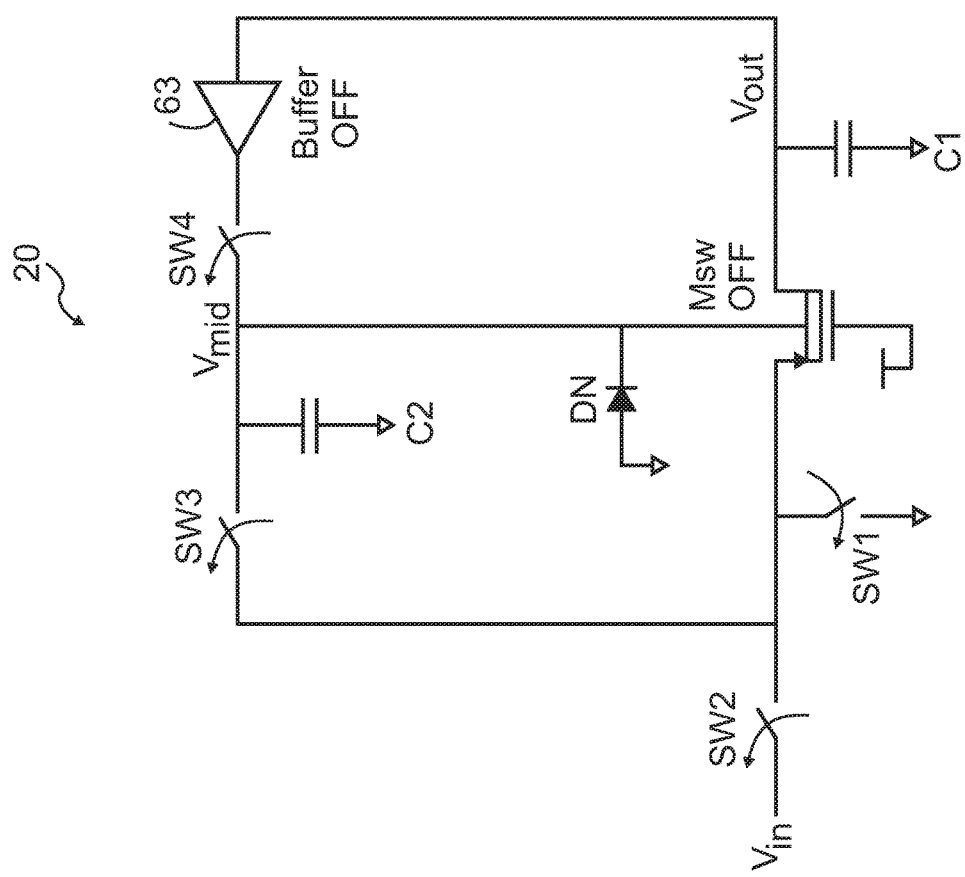

At the completion of the sampling phase or mode of operation, S/H circuit makes a transition to the hold mode of operation (S/H circuit 20 typically is in the hold mode or phase of operation most of the time, because of the typical application of a S/H circuit). FIG. 8 shows the hold mode of phase.

In the hold mode, switches SW2 and SW3 are off. Thus, the input voltage is isolated from capacitor C2. Transistor Msw is also off (except for leakage currents), which isolates capacitor C1 and therefore voltage Vout from switches SW1-SW3. Switch SW1 is turned on to eliminate the leakage current from the output node (voltage Vout), to the source of transistor Msw. During this mode, voltage Vmid is coupled to the bulk of transistor Msw, capacitor C2, and diode DN.

During the hold mode, switch SW4 is off or open. Thus, the output of duty-cycled buffer 63 is isolated from the rest of S/H circuit 20. As switch SW4 is off, at least some (or perhaps all) of the circuitry in duty-cycled buffer 63 is turned off to reduce power consumption.

With the passage of time, circuit leakage currents, for example, the leakage current through diode DN, pulls down voltage Vmid, i.e., voltage Vmid will drift away from or will be different from output voltage Vout. Once the difference between voltage Vmid and output voltage Vout is considerable or not negligible, the output node (with voltage Vout) begins to leak to the bulk of transistor Msw, and output voltage will change as a result.

Figure 9:
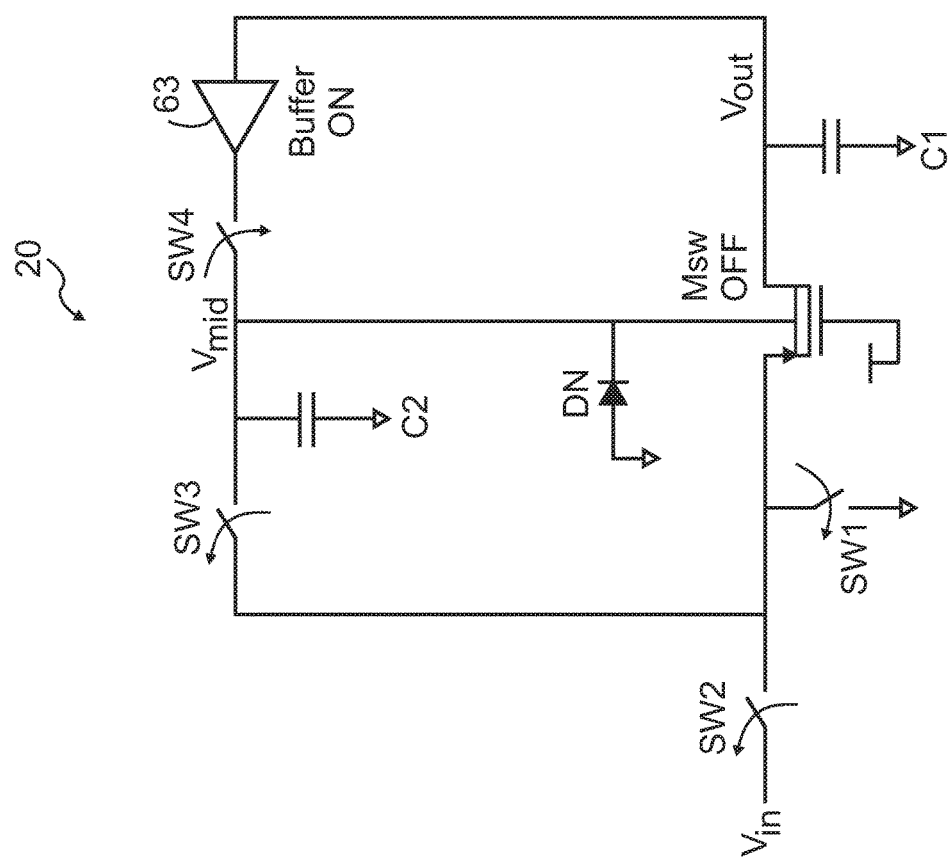

To prevent that outcome, the refresh mode or phase of operation is used. FIG. 9 shows the refresh mode. In the refresh phase, duty-cycled buffer 63 is turned on (or powered up or powered or enabled). Switch SW4 is also turned on.

Duty-cycled buffer 63, whose input is the output voltage Vout (which has not yet changed) charges capacitor C2, i.e., restores voltage Vmid. Subsequently, duty-cycled buffer 63 is turned off. Once voltage Vmid is restored to the correct voltage, the source of leakage from the output node (voltage Vout) is eliminated (or nearly or substantially eliminated in a practical, real-life implementation).

Relative to S/H circuit 10 (see FIG. 1), S/H circuit 20 in FIG. 6 consumes less power (e.g., because of the duty-cycled nature of buffer 63). In the proposed approach the buffer is enabled every now and then or over time to restore voltage Vmid to the same level as the output voltage Vout. Conversely, in S/H circuit 10, buffer 16 is always on, which means it is always consuming power.

As a numerical example, assume the refresh rate for S/H circuit 20 is 1 kHz (i.e., a refresh occurs every 1 ms). Assume further that the refresh process consumes or takes about 10 μs (the refresh period is 10 microseconds). In other words, with duty cycle defined as 100%×$t_f$/T, where $t_f$ and T represent the refresh period and the period between successive refreshes, duty-cycled buffer 63 is on for 1% of the time.

In other words, in the example described above, the power consumption of the buffer is improved 100 times compared to the conventional approach (see FIG. 1). Assuming that the buffer consumes 10 nA of current in a conventional approach, in S/H 20 in FIG. 6, the current drawn by duty-cycled buffer 63 is about 0.1 nA.

In exemplary embodiments, duty-cycled buffer 63 may be implemented in a variety of ways, as persons of ordinary skill in the art will understand. The choice of implementation depends on factors such as available technology (e.g., semiconductor fabrication process), design and performance specifications, cost, chip area, and the like, as persons of ordinary skill in the art will understand.

Without limitation, in some embodiments, a supply voltage to duty-cycled buffer 63 may be interrupted or controlled in order to turn off duty-cycled buffer 63 (conversely, the supply voltage may be applied to turn on duty-cycled buffer 63). In some embodiments, a bias current or voltage in duty-cycled buffer 63 may be turned off or changed in order to turn off or on various circuitry in duty-cycled buffer 63.

In exemplary embodiments, various switches, such as switches SW1-SW4 in FIG. 6, may be implemented in a variety of ways, as persons of ordinary skill in the art will understand. Without limitation, the switches may be implemented using MOSFETs (as is transistor Msw), as desired.

Furthermore, in exemplary embodiments, the various switches and transistor Msw are controlled via appropriate control signals. In some embodiments, the switches and transistor Msw are controlled via a controller (not shown). By applying appropriate control signals, the controller may cause switches SW1-SW4 to be opened or closed, depending on the mode of operation of S/H circuit 20, as described above.

Similarly, the controller controls transistor Msw. More specifically, the controller applies an appropriate control signal to the gate of transistor Msw to turn it on or off, depending on the mode of operation of S/H circuit 20, as described above.

In exemplary embodiments, the controller may be implemented in a variety of ways, as persons of ordinary skill in the art will understand. Without limitation, examples include finite state machines (FSMs), general logic controllers or circuits, and the like, as desired, and as persons of ordinary skill in the art will understand.

In some embodiments, the controller may be a host. The host may take a variety of forms and include a variety of circuitry, as persons of ordinary skill in the art will understand. Without limitation, the host may be a processor, MCU, and the like, as persons of ordinary skill in the art will understand.

The host may communicate with or interface with the switches in S/H circuit 20. By applying appropriate control signals, the host may cause the switches to be opened or closed, depending on the mode of operation of S/H circuit 20, as described above.

In some embodiments, control signals may be applied directly to one or more of the switches, without using a controller or host. In this situation, the user of S/H circuit 20 or a circuit under the control of the user or other source, may apply control signal(s) to cause the switch(es) to open or close, as described above. Similar arrangements may be used for transistor Msw.

In exemplary embodiments, arrangements similar to those described to control the switches and transistor Msw may be used to control duty-cycled buffer 63. For example, in some embodiments, a controller may turn on (or enable) and turn off (or disable) duty-cycled buffer 63, depending on the mode of operation of S/H circuit 20, as described above. Other arrangements (e.g., host, processor, MCU, direct application of control signals) may also be used to control the operation of duty-cycled buffer 63 (e.g., turn on or enable, turn off or disable), as desired, and as persons of ordinary skill in the art will understand.

Figure 11:
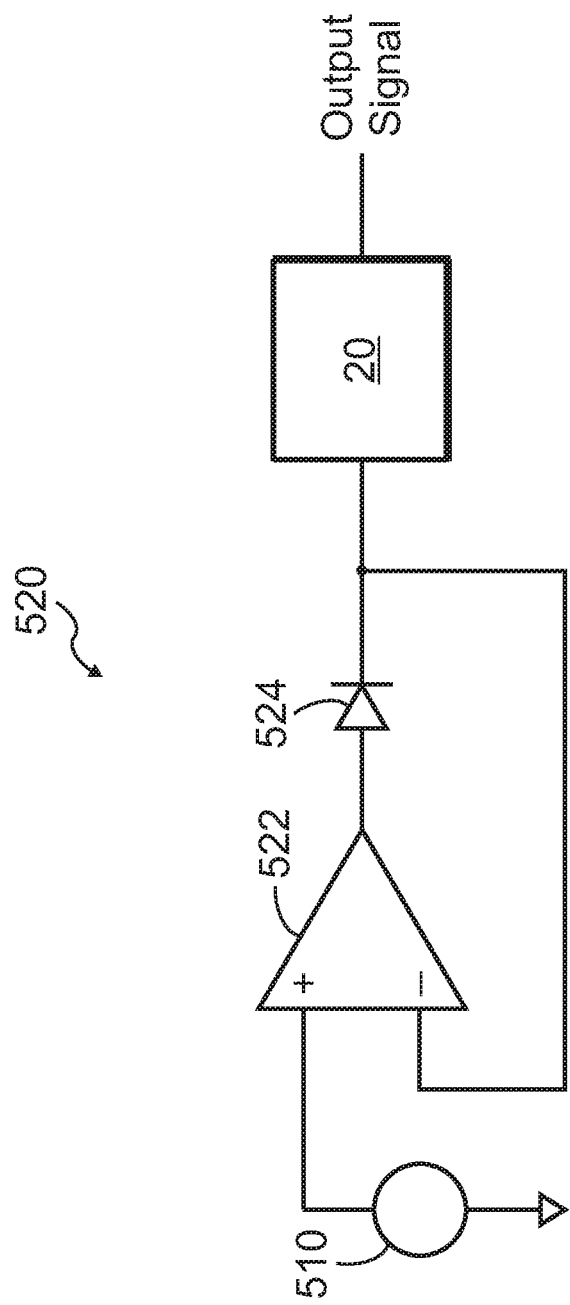
FIG. 11 shows a circuit arrangement for using a S/H circuit according to another exemplary embodiment.
Figure 12:
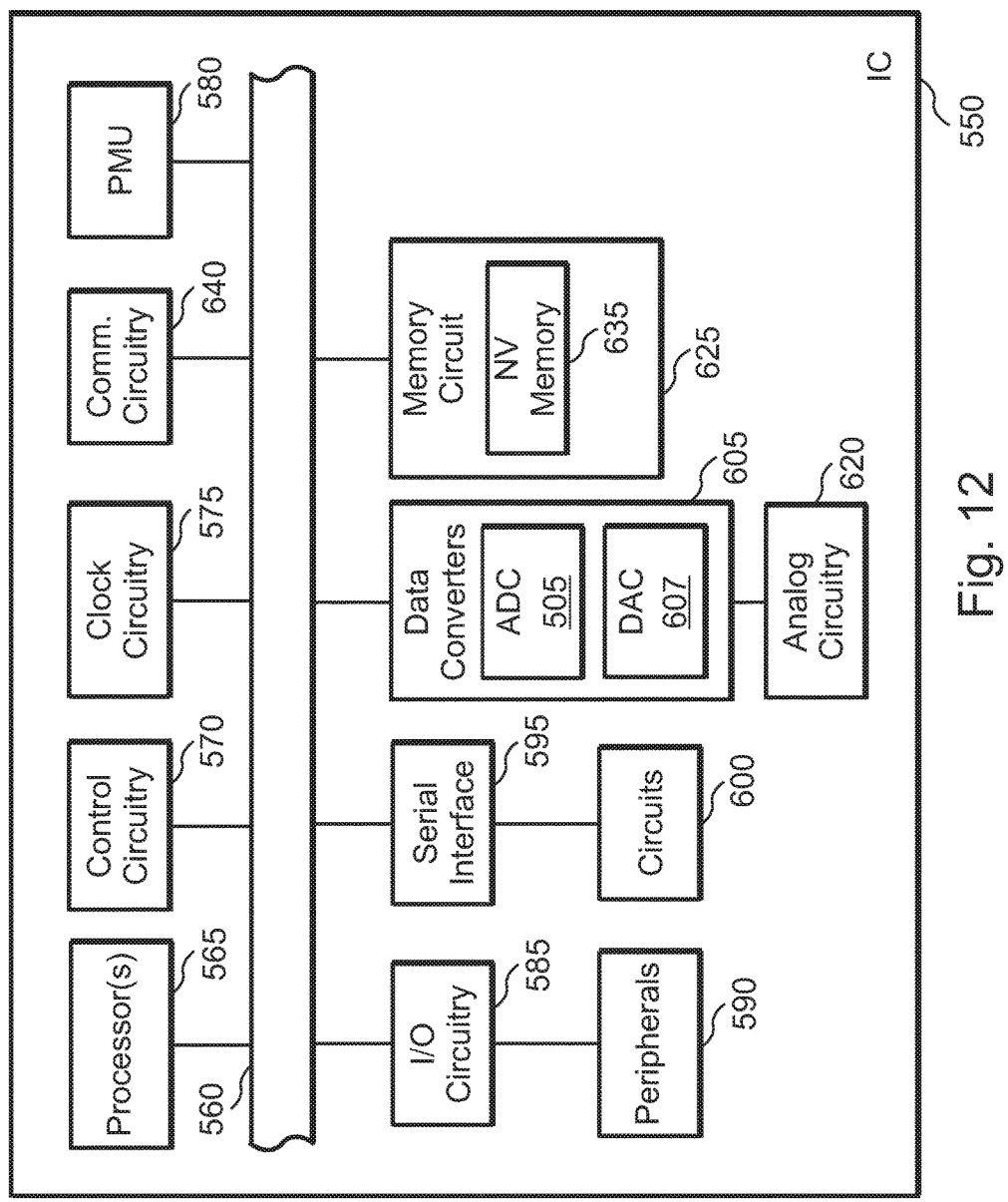
FIG. 12 shows a block diagram of an IC, including a microcontroller unit (MCU), according to an exemplary embodiment.

As noted, S/H circuits according to exemplary embodiments may be used in a variety of circuitry and applications. To illustrate, without limitation, FIGS. 10-12 provide some examples.

Figure 10:
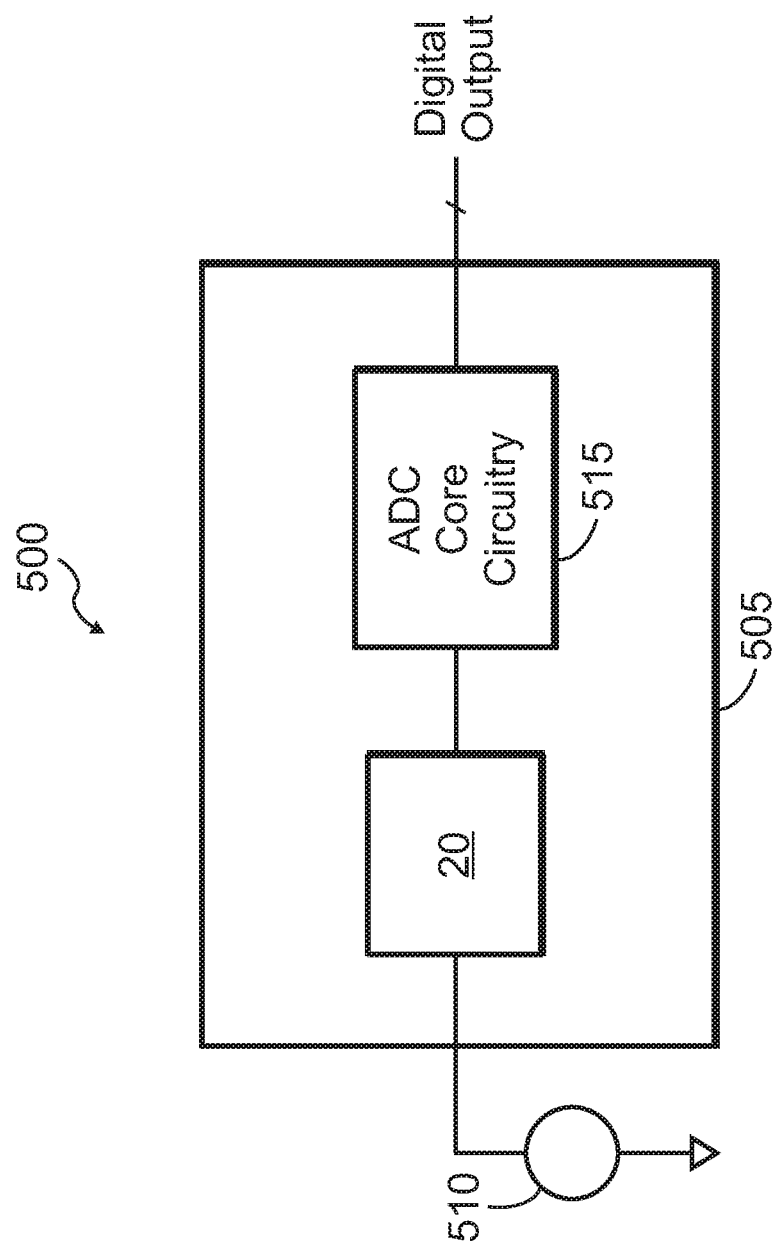
FIG. 10 shows a circuit arrangement for using a S/H circuit according to an exemplary embodiment.

FIG. 10 shows a circuit arrangement 500 for using a S/H circuit 20 according to an exemplary embodiment. More specifically, circuit arrangement 500 shows the use of S/H circuit 20 in an analog-to-digital converter (ADC 505).

ADC 505 converts an analog signal supplied by signal source 510 to a digital output signal. ADC 505 includes S/H circuit 20, and ADC core circuitry 515. S/H circuit 20 samples the signal supplied by signal source 510, and holds the sampled value. At various intervals in time, the sample and hold operation may be repeated, as desired.

In some embodiments, the sample and hold operation may be performed under the control of ADC core circuitry 515 or a controller (not shown) in ADC 505. In some embodiments, the sample and hold operation may be performed under the control of a controller or circuit external to ADC 505.

ADC core circuitry 505 uses the output signal of S/H circuit 20 as the analog signal that it converts to a digital format. ADC core circuitry 505 may use a variety of techniques to perform the analog to digital conversion, as persons of ordinary skill in the art will understand. In some embodiments, ADC core circuitry 505 may use a successive-approximation technique to perform the signal conversion.

FIG. 11 shows a circuit arrangement 520 for using a S/H circuit 20 according to another exemplary embodiment. More specifically, circuit arrangement 520 illustrates a peak detector circuit.

The peak detector circuit detects and holds the peak values of a signal supplied by signal source 510. An amplifier 522 receives the signal supplied by signal source 510 at its non-inverting input. A diode 524 couples the output of amplifier 522 to its inverting input.

Diode 524 also couples the output of amplifier 522 to the input of S/H circuit 20. In other words, S/H circuit 20 receives its input voltage from the output of amplifier 522 through diode 524. In response to a control signal from a controller (not shown), S/H circuit 20 samples the signal provided via diode 524. In response to the control signal (e.g., a change to indicate switching from the sample mode to the hold mode), S/H circuit 20 then holds the sampled signal, and provides the held signal as an output signal of the peak detector.

In some embodiments, one or more S/H circuits 20 may be integrated in an IC that includes an MCU. FIG. 12 shows a circuit arrangement 500 of such an embodiment.

Circuit arrangement 500 includes an IC 550, which constitutes or includes an MCU. IC 550 includes a number of blocks (e.g., processor(s) 565, data converter 605, I/O circuitry 585, etc.) that communicate with one another using a link 560. In exemplary embodiments, link 560 may constitute a coupling mechanism, such as a bus, a set of conductors or semiconductors for communicating information, such as data, commands, status information, and the like.

IC 550 may include link 560 coupled to one or more processors 565, clock circuitry 575, and power management circuitry or PMU 580. In some embodiments, processor(s) 565 may include circuitry or blocks for providing computing functions, such as central-processing units (CPUs), arithmetic-logic units (ALUs), and the like. In some embodiments, in addition, or as an alternative, processor(s) 565 may include one or more DSPs. The DSPs may provide a variety of signal processing functions, such as arithmetic functions, filtering, delay blocks, and the like, as desired.

Clock circuitry 575 may generate one or more clock signals that facilitate or control the timing of operations of one or more blocks in IC 550. Clock circuitry 575 may also control the timing of operations that use link 560. In some embodiments, clock circuitry 575 may provide one or more clock signals via link 560 to other blocks in IC 550.

In some embodiments, PMU 580 may reduce an apparatus's (e.g., IC 550) clock speed, turn off the clock, reduce power, turn off power, or any combination of the foregoing with respect to part of a circuit or all components of a circuit. Further, PMU 580 may turn on a clock, increase a clock rate, turn on power, increase power, or any combination of the foregoing in response to a transition from an inactive state to an active state (such as when processor(s) 565 make a transition from a low-power or idle or sleep state to a normal operating state).

Link 560 may couple to one or more circuits 600 through serial interface 595. Through serial interface 595, one or more circuits coupled to link 560 may communicate with circuits 600. Circuits 600 may communicate using one or more serial protocols, e.g., SMBUS, I²C, SPI, and the like, as person of ordinary skill in the art will understand.

Link 560 may couple to one or more peripherals 590 through I/O circuitry 585. Through I/O circuitry 585, one or more peripherals 590 may couple to link 560 and may therefore communicate with other blocks coupled to link 560, e.g., processor(s) 365, memory circuit 625, etc.

In exemplary embodiments, peripherals 590 may include a variety of circuitry, blocks, and the like. Examples include I/O devices (keypads, keyboards, speakers, display devices, storage devices, timers, etc.). Note that in some embodiments, some peripherals 590 may be external to IC 550. Examples include keypads, speakers, and the like.

In some embodiments, with respect to some peripherals, I/O circuitry 585 may be bypassed. In such embodiments, some peripherals 590 may couple to and communicate with link 560 without using I/O circuitry 585. Note that in some embodiments, such peripherals may be external to IC 550, as described above.

Link 560 may couple to analog circuitry 620 via data converter 605. Data converter 405 may include one or more ADCs 505 and/or one or more DACs 607. The ADC(s) 505 receive analog signal(s) from analog circuitry 620, and convert the analog signal(s) to a digital format, which they communicate to one or more blocks coupled to link 560. In some embodiments, one or more of ADCs 505 includes one or more S/H circuits 20, as desired.

Analog circuitry 620 may include a wide variety of circuitry that provides and/or receives analog signals. Examples include sensors, transducers, buffers, amplifiers, comparators, etc., as persons of ordinary skill in the art will understand. In some embodiments, analog circuitry 620 may communicate with circuitry external to IC 550 to form more complex systems, sub-systems, control blocks, and information processing blocks, as desired. In some embodiments, analog circuitry 620 includes one or more S/H circuits 20, as desired.

Control circuitry 570 couples to link 560. Thus, control circuitry 570 may communicate with and/or control the operation of various blocks coupled to link 560. In addition, control circuitry 570 may facilitate communication or cooperation between various blocks coupled to link 560.

In some embodiments, control circuitry 570 may initiate or respond to a reset operation. The reset operation may cause a reset of one or more blocks coupled to link 560, of IC 550, etc., as person of ordinary skill in the art will understand. For example, control circuitry 570 may cause PMU 580 to reset to an initial state.

In exemplary embodiments, control circuitry 570 may include a variety of types and blocks of circuitry. In some embodiments, control circuitry 570 may include logic circuitry, finite-state machines (FSMs), or other circuitry to perform a variety of operations, such as the operations described above.

Communication circuitry 640 couples to link 560 and also to circuitry or blocks (not shown) external to IC 550. Through communication circuitry 640, various blocks coupled to link 560 (or IC 550, generally) can communicate with the external circuitry or blocks (not shown) via one or more communication protocols. Examples include USB, Ethernet, and the like. In exemplary embodiments, other communication protocols may be used, depending on factors such as specifications for a given application, as person of ordinary skill in the art will understand.

As noted, memory circuit 625 couples to link 560. Consequently, memory circuit 625 may communicate with one or more blocks coupled to link 560, such as processor(s) 365, control circuitry 570, I/O circuitry 585, etc. Memory circuit 625 provides storage for various information or data in IC 550, such as operands, flags, data, instructions, and the like, as persons of ordinary skill in the art will understand. Memory circuit 625 may support various protocols, such as double data rate (DDR), DDR2, DDR3, and the like, as desired. In some embodiments, the memory read and/or write operations involve the use of one or more blocks in IC 550, such as processor(s) 565. A direct memory access (DMA) arrangement (not shown) allows increased performance of memory operations in some situations. More specifically, the DMA (not shown) provides a mechanism for performing memory read and write operations directly between the source or destination of the data and memory circuit 625, rather than through blocks such as processor(s) 565.

Memory circuit 625 may include a variety of memory circuits or blocks. In the embodiment shown, memory circuit 625 includes non-volatile (NV) memory 635. In addition, or instead, memory circuit 625 may include volatile memory (not shown), such as random access memory (RAM). NV memory 635 may be used for storing information related to performance or configuration of one or more blocks in IC 550.

Referring to the figures, persons of ordinary skill in the art will note that the various blocks shown might depict mainly the conceptual functions and signal flow. The actual circuit implementation might or might not contain separately identifiable hardware for the various functional blocks and might or might not use the particular circuitry shown. For example, one may combine the functionality of various blocks into one circuit block, as desired. Furthermore, one may realize the functionality of a single block in several circuit blocks, as desired. The choice of circuit implementation depends on various factors, such as particular design and performance specifications for a given implementation. Other modifications and alternative embodiments in addition to the embodiments in the disclosure will be apparent to persons of ordinary skill in the art. Accordingly, the disclosure teaches those skilled in the art the manner of carrying out the disclosed concepts according to exemplary embodiments, and is to be construed as illustrative only. Where applicable, the figures might or might not be drawn to scale, as persons of ordinary skill in the art will understand.

The particular forms and embodiments shown and described constitute merely exemplary embodiments. Persons skilled in the art may make various changes in the shape, size and arrangement of parts without departing from the scope of the disclosure. For example, persons skilled in the art may substitute equivalent elements for the elements illustrated and described. Moreover, persons skilled in the art may use certain features of the disclosed concepts independently of the use of other features, without departing from the scope of the disclosure.

The invention claimed is:

1. An apparatus, comprising:
   a sample-and-hold (S/H) circuit, comprising:
      a first switch coupled to receive an input signal, the first switch further coupled to a first capacitor;
      a buffer coupled to buffer a voltage across the first capacitor; and
      a voltage source coupled to an input of the buffer to apply an offset voltage to the input of the buffer.

2. The apparatus according to claim 1, further comprising a second switch coupled to the first switch.

3. The apparatus according to claim 2, wherein during a sample mode of the S/H circuit, the second switch is open.

4. The apparatus according to claim 3, wherein during a hold mode of the S/H circuit, the second switch is closed.

5. The apparatus according to claim 2, further comprising a third switch coupled to provide the input signal to the first switch.

6. The apparatus according to claim 5, wherein the first switch comprises a first metal semiconductor field effect transistor (MOSFET), the second switch comprises a second MOSFET, and the third switch comprises a third MOSFET.

7. The apparatus according to claim 1, wherein the voltage source has a voltage derived from a maximum expected negative internal offset voltage of the buffer.

8. The apparatus according to claim 1, wherein the voltage source applies the offset voltage to the input of the buffer to reduce a leakage current of the S/H circuit.

9. An apparatus, comprising:
   a sample-and-hold (S/H) circuit, comprising:
      a transistor to provide an input signal that is to be sampled to a first capacitor;
      a duty-cycled buffer to selectively buffer a voltage across the first capacitor and to provide a buffered voltage to a node coupled to a bulk of the transistor in order to reduce a power consumption of the S/H circuit.

10. The apparatus according to claim 9, wherein the duty-cycled buffer is enabled or turned on in order to buffer the voltage across the first capacitor and to provide the buffered voltage.

11. The apparatus according to claim 9, wherein the S/H circuit has a sample mode of operation, a hold mode of operation, and a refresh mode of operation.

12. The apparatus according to claim 11, wherein the duty-cycled buffer is enabled or turned on during the refresh mode of operation of the S/H circuit.

13. The apparatus according to claim 11, wherein the duty-cycled buffer is disabled or turned off during the sample and hold modes of operation of the S/H circuit.

14. The apparatus according to claim 9, further comprising:
   a first switch coupled to the transistor and to ground;
   a second switch coupled to provide the input signal to the transistor;
   a third switch coupled to the first switch and to a second capacitor and to the bulk of the transistor; and
   a fourth switch coupled to the duty-cycled buffer and to the second capacitor.

15. The apparatus according to claim 13, wherein the transistor comprises a metal oxide semiconductor field effect transistor (MOSFET), wherein the first, second, third, and fourth switches comprise, respectively, first, second, third, and fourth MOSFETs.

16. A method of using a sample and hold (S/H) circuit having a sample mode and a hold mode, the method comprising:
   providing, by using a first switch, an input signal to be sampled to a first capacitor;
   buffering, by using a buffer, a voltage across the first capacitor to provide a buffered voltage; and
   providing an offset voltage, by using a voltage source coupled to an input of the buffer, to the input of the buffer.

17. The method according to claim 16, wherein buffering, by using a buffer, a voltage across the first capacitor to provide a buffered voltage further comprises providing the buffered voltage to a bulk of the first switch.

18. The method according to claim 16, using a second switch to provide the input signal to the first switch.

19. The method according to claim 16, wherein the voltage source has a voltage derived from a maximum expected negative internal offset voltage of the buffer.

20. The method according to claim 19, wherein providing the offset voltage to the input of the buffer reduces a leakage current of the S/H circuit.

* * * * *